(12) United States Patent
Voisine

(10) Patent No.: US 6,882,137 B1
(45) Date of Patent: Apr. 19, 2005

(54) ENHANCED FAULT PROTECTION IN ELECTRICITY METER

(75) Inventor: John T. Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 0 days.

(21) Appl. No.: 10/730,807

(22) Filed: Dec. 5, 2003

Related U.S. Application Data

(60) Provisional application No. 60/431,170, filed on Dec. 5, 2002.

(51) Int. Cl.[7] ............................................. G01R 19/00
(52) U.S. Cl. ................................... 324/76.11; 324/525
(58) Field of Search .......................... 324/76.11, 76.14, 324/76.24, 508, 512, 525, 755, 549, 158.1

(56) References Cited

U.S. PATENT DOCUMENTS 5,432,916 A * 7/1995 Hahn et al. .................. 710/302
5,485,040 A * 1/1996 Sutterlin ........................ 307/3

* cited by examiner

Primary Examiner—Michael Tokar
Assistant Examiner—Trung Q. Nguyen
(74) Attorney, Agent, or Firm—Maginot, Moore & Beck

(57) ABSTRACT

An arrangement for obtaining measurable voltage signals in a utility meter wherein the measurable voltage signals are representative of a power line voltage signal. Includes a first connection to a phase of a power line, a second connection to a reference of a power line, a voltage divider circuit, and a series impedance element. The voltage divider circuit is disposed on a circuit board and is coupled between a first node and the second connection. The voltage divider circuit has an output configured to provide measurable voltage signals to a circuit operable to generate voltage measurement information. The voltage divider circuit has a first impedance value. The series impedance element is disposed apart from the circuit board and is configured for current limiting. The series impedance element is coupled between the first connection and the first node and has a second impedance value.

20 Claims, 2 Drawing Sheets

ENHANCED FAULT PROTECTION IN ELECTRICITY METER

This application claims the benefit of U.S. Provisional patent Application Ser. No. 60/431,170, filed Dec. 5, 2002, which is incorporated herein by reference.

FIELD OF THE INVENTION

The present invention relates generally to electricity meters, and more particularly, to fault protection in electricity meters.

BACKGROUND OF THE INVENTION

Electricity meters are devices that perform measurements related to power and energy consumption. For example, electricity meters may be used to measure energy consumption by a customer load. Electricity meters also measure other properties relating to energy consumption such as voltage levels, current levels, and power factor by way of example. Utility service providers employ electricity meters to track customer usage for many purposes, including billing, planning and tracking demand for electrical power.

Historically, electricity meters employed electromechanical "rotating disk" meters that measured energy consumption using magnetic flux induced by line voltage and line current on core elements disposed about a rotatable disk. The rotations of the disk were registered on mechanical counters to track quantities of energy being used.

Increasingly, meters employ electronic circuits to reduce the number of moving parts, and to provide enhanced metering and data collection services. In general, electricity meters having such electronic circuits may be divided into two general parts: a sensor part and a measurement part. Meters may have additional parts, of course, such as a communication interface, radio, enhanced memory, and any number of features. However, the fundamental portions of the meter include the sensor part and the measurement part, and are present in every meter.

The sensor part includes primarily analog circuitry in the form of sensor devices that are connected to the electrical system of a facility, and more particularly, to the power lines. The sensor devices generate voltage and current measurement signals that are indicative of the voltage and current in the power lines. The measurement part includes primarily digital circuitry that receives and processes the measurement signals generated by the sensor part. As a result of this processing, the measurement part generates metering data representing, for example: watt-hours, volt-amps ("VAs"), reactive volt-amps ("VARs") and other information that quantifies the power consumed by the facility.

Referring again to the sensor portion of the meter, in order to obtain voltage measurement signals, the sensor devices often include an electrical connection to the utility power lines that supply the load. In order to obtain current measurement signals, the sensor devices may employ a current measurement transformer or other device that indirectly obtains current measurements.

In order to facilitate measurement by electronic circuitry, the line voltage in the voltage measurement signals must typically be reduced. To this end, the measurement circuit may include step down elements, such as, for example, a voltage divider that translates line voltage values, which may be 120 Volts AC, 277 Volts AC or higher, to a low voltage measurement range of less than 5 Volts peak to peak.

Although the measurement circuit steps down the high line voltages, the high line voltages are still present within the meter in or around the sensor portion. An issue that arises with utility meters relates to these high line voltages received in the sensor devices within the electricity meter. Electricity meters sometimes encounter line surges that can exceed the level of surge protection normally provided within the meter. Normal surge protection may include elements such as fuses, MOVs, or other elements disposed on the circuit board that carries the measurement circuit. Line surges are particularly troublesome in multiphase meters because phase to phase arcing could occur in some circumstances. Phase to phase arcing in electricity meters can result in an undesirable failure mode, particularly when phase to phase voltage exceed about 350 volts.

In particular, phase to phase arcing involves a phenomenon called power follow through. In particular, phase to phase arcing results in effectively causing a short circuit between phases. The short circuit provides a low resistance over which the high phase to phase voltage must be dissipated, resulting in very large currents. The large currents that occur as a consequence of phase to phase arcing is called power follow through. Power follow through can cause significant damage to the meter and/or the meter's surroundings.

Power follow through is particularly troublesome for phase to phase arcing as compared to phase to neutral arcs. Phase to neutral arcs present less trouble because they often extinguish themselves at the zero crossing of the AC waveform. By contrast, phase to phase arcs do not extinguish at the zero crossings, and also tend to have higher voltages to dissipate. For example, in a 277 volt four wire wye system, the phase to neutral voltage of each phase is 277 volts. However, there exists 480 volts from phase to phase. Arcs over approximately 350 volts within a meter are less likely to self-extinguish and thus can result in large power follow through. Thus, phase to phase arcing creates a greater risk of damaging power follow through than phase to neutral arcing.

The risk of arcing exists anywhere within the meter that exposed conductors of different phase voltages are present. Obviously, the closer the conductors, the greater the chance of arcing. Regardless of efforts to isolate exposed conductors carrying phase voltages, there is always a danger of phase to phase arcing for a variety of reasons.

There is a need, therefore, for a method and/or apparatus that helps reduce the potential for damaging due to line surges in electricity meters.

SUMMARY OF THE INVENTION

The present invention addresses the above described problem, as well as others, by providing a series impedance in line with the input to the measurement circuit of an electricity meter. The series impedance is preferably disposed on the power line side of locations within the electricity meter that are likely to experience an arc. As a consequence, the series impedance forms a load over which power follow through from an arc may be dissipated. In particular, if a line surge and/or other phenomenon causes a phase to phase arc, the phase to phase short circuit does not provide as high a current for power follow through because the series impedance limits the current through the phase to phase circuit.

One embodiment of the invention is an arrangement for obtaining measurable voltage signals in a utility meter wherein the measurable voltage signals are representative of a power line voltage signal. The arrangement includes a first connection to a phase of a power line, a second connection to a reference of a power line, a voltage divider circuit, and a series impedance element. The voltage divider circuit is disposed on a circuit board and is coupled between a first node and the second connection. The voltage divider circuit has an output configured to provide measurable voltage signals to a circuit operable to generate voltage measurement information. The voltage divider circuit has a first impedance value. The series impedance element is disposed apart from the circuit board and is configured for current limiting. The series impedance element is coupled between the first connection and the first node and has a second impedance value.

Another aspect according to the invention is an associated method for providing such a series impedance element. Still another aspect is an associated method employed in a retrofit circumstance.

The above described features and advantages, as well as others, will become more readily apparent to those of ordinary skill in the art by reference to the following detailed description and accompanying drawings.

DETAILED DESCRIPTION

Figure 1:
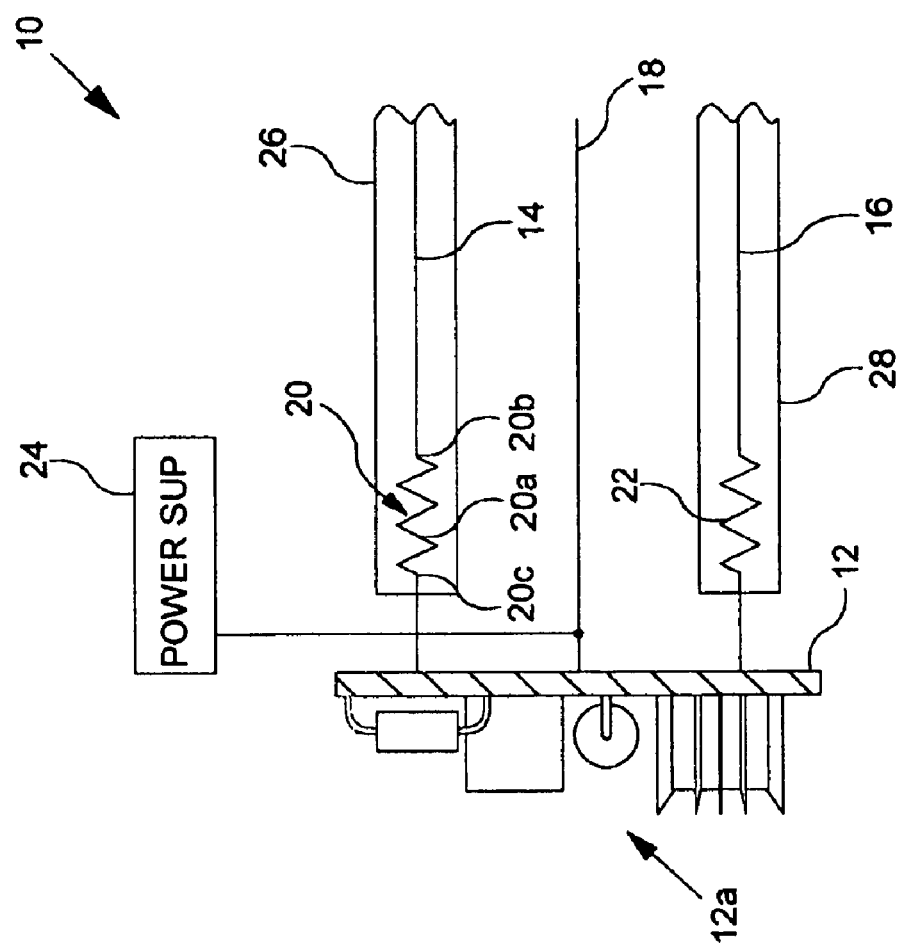
FIG. 1 illustrates a first embodiment of an arrangement for obtaining measurable voltage signals in an electricity meter according to the present invention.
Figure 2:
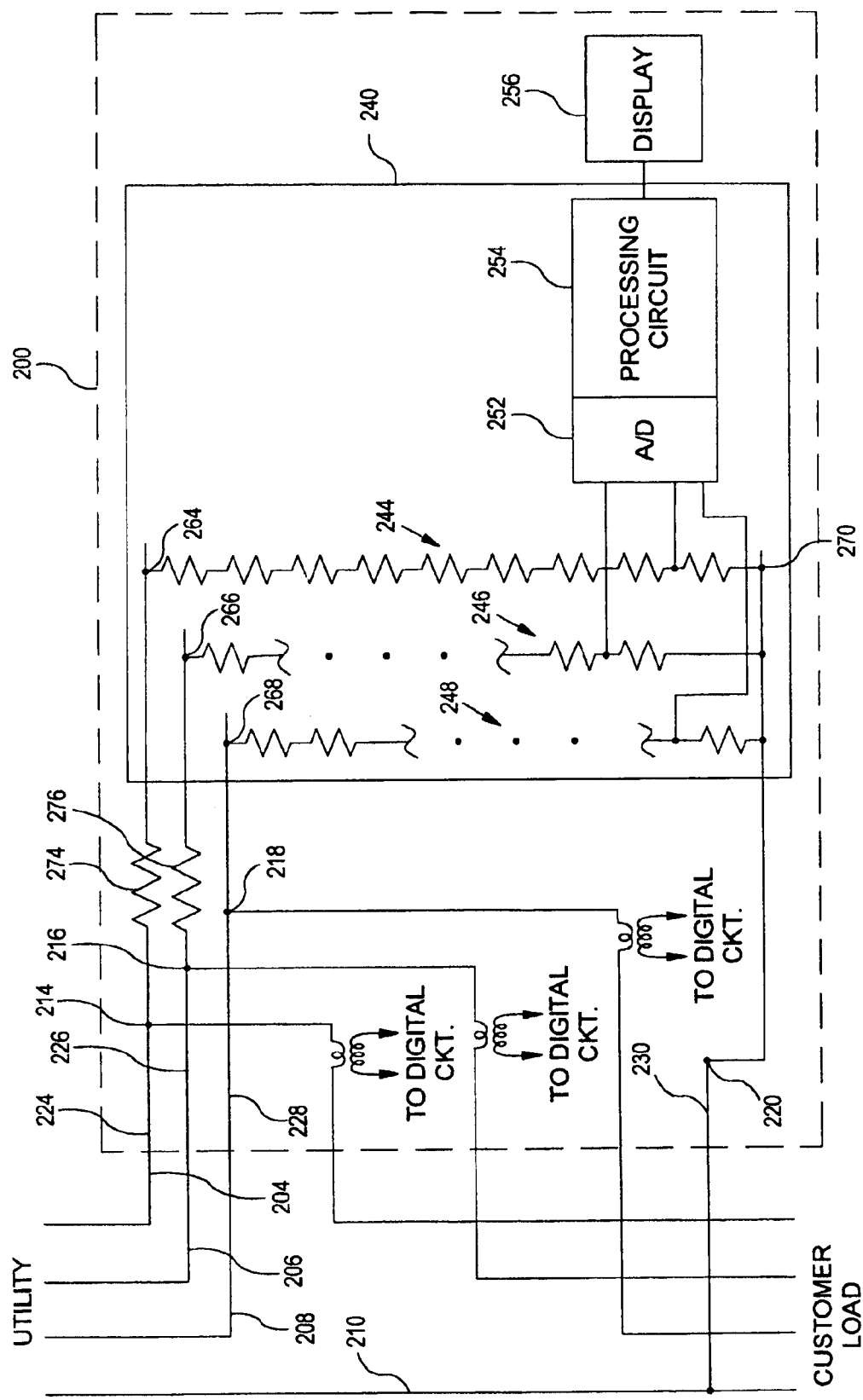
FIG. 2 is a schematic diagram of a second embodiment of an arrangement for obtaining measurable voltage signals in an electricity meter according to the present invention.

FIGS. 1 and 2 show implementations of the invention. FIG. 1 shows a part schematic, part plan view of a first exemplary embodiment of an arrangement 10 for use in a polyphase electricity meter according to the invention. The arrangement 10 includes a measurement circuit board 12 on which is disposed a measurement circuit 12a, a phase A line connection 14, a phase B line connection 16 and a phase C line connection 18. The arrangement 10 further includes a first impedance 20 disposed in series between the phase A line connection and the measurement circuit board 12, and a second impedance 22 disposed in series between the phase B line connection and the measurement circuit board 12. The phase C line connection 18 is connected directly to the measurement circuit board 12, and to a power supply 24 which may or may not be disposed on the measurement circuit board 12. A line connection is a connection to the high voltage provided by the mains electrical lines.

The measurement circuit board 12 includes all or part of a polyphase electricity meter measurement circuit 12a. The measurement circuit 12a, not shown in schematic representation may take any suitable form. Polyphase electricity meter measurement circuits are well known in the art, and typically include an analog to digital converter and one or more digital processors, not shown in FIG. 1. (See e.g. FIG. 2). Exemplary meter measurement circuits are disclosed in U.S. Pat. No. 6,112,158, U.S. Pat. No. 5,631,554 and U.S. Pat. No. 5,544,089, all of which are incorporated herein by reference.

In the embodiments described herein, the measurement circuit 12a has a significant input resistance or impedance. In particular, the measurement circuit 12a has a high input impedance in order to reduce the amount of power that is consumed in the measurement process. It would not be uncommon for the measurement circuit 12a to have a large input impedance, for example, on the order of 1,000,000 ohms.

The first impedance element 20 has an impedance value that is relatively low compared to the input impedance of the meter measurement circuit 12. For example, the first impedance element 20 has an impedance value that is at least two orders of magnitude and preferably at least three orders of magnitude below the input impedance of the measurement circuit 12a in order to reduce the impact that the first impedance 20 has on voltage measurements performed by the measurement circuit 12a. To this end, it is preferable that the addition of the first impedance 20, which is separate from the measurement circuit board 12 and measurement circuit 12, will not require special calibration procedures. Indeed, it is preferably that the first impedance 20 may be added as a retrofit after calibration of the meter. Accordingly, the first impedance 20 is preferably chosen that it has little meaningful effect on the operation of the measurement circuit 12a. The second impedance 22 has a similar impedance value.

The first impedance 20 has a central element 20a and two leads 20b, 20c. To this end, the first impedance 20 may suitably be thin wire coil with end leads, carbon composition resistor (but preferably not a carbon film composition resistor), a metal film resistor, or a wire wound resistor. Other suitable resistors may also be used. The second impedance 22 preferably has a construction similar to that of the first impedance 20. The first impedance 20 and the second impedance 22 should have a resistance value high enough to significantly limit current in a phase to phase arc.

It is noted that a third impedance may be used between the phase C line connection 18 and the measurement circuit board 12, so long as the third impedance is not series connected between the phase C line connection and the power supply 24, which will typically have a much lower input impedance.

In normal operation, the first and second impedances 20 and 22 have little effect on the operation of the meter. However, in the event of a line surge that causes an inter-phase (e.g. phase A to phase C) arc within the measurement circuit or otherwise on or near the measurement circuit board 12, but prior to the input impedance of the measurement circuit 12b, the line impedances 20 and 22 serve to provide protection against significant power follow-through.

For example, consider an arc from phase A to phase C that occurs on the circuit board 12. If the power lines 14, 16 and 18 are 277 volt power lines, the phase to phase arc could be at 480 volts. As discussed above, an arc at 480 volts may not self-extinguish immediately. However, the 480 volt potential is dropped across the first impedance 20, which preferably is about 200 ohms, and thus the current and power follow through is greatly reduced as opposed to a mere short circuit across low resistance conductors.

It is also desirable to provide some additional protection in the arrangement 10 to prevent, for example, arcing on the line side of the impedances 20, 22. To reduce the possibility of an arc on the line side of the line impedances 20, 22, insulation sleeves 26 and 28 are provided that electrically isolate the phase A line connection 14 and the phase B line connection 16. Preferably, the insulation sleeves 26 and 28 extend up through the impedance devices 20 and 22 to further reduce the risk of arcing. In any event, at least the line side lead (e.g. 20b) should be covered by the sleeves 26 and 28.

It has been found that the dissipation of arc energy through the impedance devices 20 and 22 causes heat energy. Accordingly, the insulation sleeves 26 and 28 are preferably of a flame resistant material. For example, the sleeves 26 and 28 may suitably be constructed from commercially available VARGLASS™, which is a glass braid with a silicon coating. Other flame resistant materials, however, may be used.

FIG. 2 shows in further detail a schematic circuit diagram of an exemplary meter that employs an embodiment of the invention. In FIG. 2, a meter 200 is configured to measure energy consumption by a load 202 receiving power over a phase A power line 204, a phase B power line 206, and a phase C power line 208. A neutral or reference line 210 is also provided. The line energy on the power lines 204, 206, and 208 passes through the meter 200 in many embodiments, such as the one shown in FIG. 2, to facilitate obtaining voltage and current measurement signals. To this end the meter 200 includes current coils 224, 226 and 228 that are series connected in the power lines 204, 206 and 208 respectively. The current coils 224, 226 and 228 as is known in the art typically include blades that connect to the respective power lines 204, 206 and 208, and a conductor disposed between the blades that passes through the interior of the meter 200.

In any event, the meter 200 includes a first connection 214 that is electrically connected to the phase A power line 204 on the line side of the current coil 224, a second connection 216 that is electrically connected to the phase B power line 206 on the line side of the current coil 226, and a third connection 218 that is electrically connected to the phase C power line 208 on the line side of the current coil 228. The meter 200 also includes a reference connection 220 that is connected to the neutral line 210 typically through a neutral blade 230 of the meter. The above-described connections 214, 216 and 218 provide a source of voltage measurement signals for each of the power lines 204, 206 and 208.

The meter 200 further includes current transformers 234, 236 and 238 operably coupled to obtain current measurement signals from the power lines 204, 206 and 208, respectively. The current transformers 234, 236 and 238 are operably coupled to the A/D converter circuit 252, discussed further below. It will be appreciated that in other embodiments, other devices may be used to obtain current measurements such as, for example, embedded coils or shunts.

The meter 200 includes a circuit board 240 on which is disposed a plurality of voltage divider circuits 244, 246 and 248, an A/D converter circuit 252, a digital processing circuit 254, and a display 256. The voltage divider circuit 244 is coupled between a first node 264 disposed on the circuit board 240 and a reference node 270 disposed on the circuit board 240. The voltage divider circuit 246 is coupled between a second node 266 disposed on the circuit board 240 and the reference node 270. The voltage divider circuit 248 is coupled between a third node 268 disposed on the circuit board 240 and the reference node 270.

The first node 264 is coupled to the first connection 214 through a series resistor 274 that is not on the circuit board 240. Similarly the second node 266 is coupled to the second connection 216 through a second series resistor 276. The third node 268 is coupled directly to the third connection 218. The series resistors 274 and 276 are preferably each about 200 ohms. Preferably, the resistors 274 and 276 are physically located near the current coil connections 214 and 216 respectively, and insulated wire is used to connect the resistors 274 and 276 to the nodes 264 and 266, respectively. Thus, the possibility of an arc between phases on the line side of 274 and 276 is greatly reduced.

The voltage divider circuits 244, 246 and 248 operate to scale down the input AC voltage from the power lines 204, 206 and 208 to voltage levels suitable for measurement. In the embodiment described herein, the voltage divider circuit 244, 246 and 248 each include a number of series connected resistors connected between the respective nodes 264, 266 and 268 and the reference node 270. The output of each voltage divider 244, 246 and 248 is connected between its corresponding last resistor (284, 286 and 288, respectively) connected to the reference node 270. The outputs are connected to the A/D converter circuit 252. Typically, each of the voltage divider circuits 244, 246 and 248 has an impedance of on the order of 1,000,000 ohms or more in order to reduce the power drain caused by the voltage measurement. In the embodiment described herein, each the voltage divider circuits 244, 246 and 248 includes a series of eight 125 KOhm resistors, with the last resistor being approximately 500 ohms.

The A/D converter circuit 252 includes one or more A/D converters that convert the scaled down voltage measurement signals into sequences of digital samples. Such A/D converter circuits are known in the art and described in, for example, U.S. Pat. No. 6,112,158, U.S. Pat. No. 5,631,554 and U.S. Pat. No. 5,544,089. The digital processing circuit 254 includes one or more processors, for example, a digital signal processor and/or a microcontroller, that generate various energy consumption data values from the digitized samples generated by the A/D converter circuit 252. Again, suitable processing circuits are described by way of example in U.S. Pat. No. 6,112,158, U.S. Pat. No. 5,631,554 and U.S. Pat. No. 5,544,089.

The digital processing circuit 254 is also preferably coupled to a display 256 that displays select energy consumption data as is known in the art. The meter 200 may suitably include other circuit elements and other functionality such as communication circuits, extended memory circuits and other features common to electricity meters.

In operation, power consumed by the load flows through the power lines 204, 206 and 208, and thus also flows through the current coils 224, 226 and 228. As a consequence, the power line voltage for each phase power line 204, 206 and 208 appears the respective connection 214, 216 and 218 within the meter 200.

The phase A power line voltage propagates from the connection 214 through the series resistor 274 and then through the voltage divider 244. Because the impedance of the voltage divider 244 is so much larger than the impedance of the series resistor 274 (e.g., 1,000,000 ohms to 200 ohms), substantially all of the phase A power line voltage is dropped across the voltage divider 244. The voltage divider 244 provides at its output a low voltage version of the voltage measurement signal, which is received by the A/D converter 252. The A/D converter circuit 252 also receives phase A current measurement signals from the current transformer 234. The A/D converter circuit 252 digitizes the phase A voltage measurement signals and the phase A current measurement signals and provides the digitized signals to the processing circuit 254.

Similarly, the phase B power line voltage propagates from the connection 216 through the series resistor 276 and then through the voltage divider 246. Again, substantially all of the phase B power line voltage is dropped across the voltage divider 246. The voltage divider 246 provides at its output a low voltage version of the voltage measurement signal, which is received by the A/D converter circuit 252. The A/D converter circuit 252 also receives phase B current measurement signals from the current transformer 236. The A/D converter circuit 252 digitizes the phase B voltage and current measurement signals and provides those signals to the processing circuit 254.

The processing circuit 254 also receives digitized phase C voltage and current measurement signals in a similar manner, with the exception that the phase C power line voltage does not propagate through a series resistor that is connected between the connection 218 and the node 268.

The processing circuit 254 uses the phase A, phase B and phase C measurement signals to generate energy consumption data, such as watt-hours, VAR-hours and/or other quantities.

The processing circuit 254 then displays at least some of the energy consumption data and/or stores the data for later retrieval in memory circuits, not shown. The processing circuit 254 may also effectuate communication of energy consumption data through an optional communication circuit, not shown, as is known in the art.

If an arc appears across phase A and phase C at locations electrically equivalent to the first node 264 and the third node 268, the arc effectively short circuits the 1,000,000 ohm input impedance of the measurement circuit (i.e. voltage dividers 264 and 268 in this case). However, the 200 ohm series resistor 274 provides a load that significant limits the power follow through that is caused by the arc/short circuit. Similarly, if an arc appears across phase B and phase C, then the series resistor 276 limits the current that is caused by the arc. Both series resistors 274 and 276 assist in limiting the current and power follow through of an arc from phase A to phase B.

It is noted that phase to neutral arcs between phase C and ground do not have an input impedance to limit the power follow through. The reason for refraining from placing an input impedance on the phase C input line is that one phase of most electricity meters is typically used to provide power to the power supply, not shown in FIG. 2, of the meter. Because power supplies have a lower input impedance, a 100 or 200 ohm series impedance on the line side of the voltage divider 248 may significantly affect the voltage measurement on that phase. Thus, it is advantageous to omit a series impedance from that phase. It will be appreciated, however, that if the meter 200 is specially calibrated after installation of the series impedances, then an impedance of 100 ohms or more may be able to be used even on the phase to which the meter power supply is connected.

It is noted that the embodiments described herein are in many cases suitable for retrofitting meters. In particular, because many of the embodiments described herein employ series resistors in such as way as to avoid significant impact on the voltage measurement signals in the measurement circuits, it is possible to add the series resistances to meters that have already been finally calibrated for use, and indeed, are already used in the field.

Accordingly, one aspect of the invention is to remove an existing meter from a connection to the power lines, install series impedances between the current blade connections and the measurement circuit board, and then reconnect the meter to the power lines.

Consistent with the embodiment discussed above in connection with FIG. 1, the series impedances 274 and 276 may be at least partly covered (at least on the line side) by an insulating sleeve, and in some embodiments, a flame-resistant insulating sleeve. However, as also discussed above, the impedances 274 and 276 may be sufficiently separated by space to significantly reduce the possibility fan interphase arc, even if the impedances 274 and 276 have little or no insulation around their leads (or elsewhere). By way of example, it has been found that separating bare leads and wires by at least 10 mm or more will greatly reduce the possibility of a sustained cross-phase arc within a utility meter. Accordingly, in one embodiment of the invention, the impedances 274 and 276 (at least the leads thereof) are not specifically shielded by a sleeve, but are nevertheless separated from each other by at least 10 mm. Moreover, the housing, not shown, of the meter 200 may be formed in such a way as to guide assembly of the meter 200 such that the impedances 274 and 276 are sufficiently spaced apart. To this end, the meter housing may include features located near the current coils 224, 226 that form a placement location for the impedances 274 and 276 in such a manner as to separate the line side leads of those impedances (and even the meter side leads) by more than 10 mm. Those features, which may be formed as molded portions of the meter housing, also serve to retain the impedances 274 and 276 in position. Such features may include posts or ribs that engage at least one edge of the impedance. The meter 200 could then include ordinary insulated wiring from the meter side leads of the impedances to the circuit board 240. In some embodiments, features molded or otherwise formed in the housing of the meter 200 may serve as insulating barriers that inhibit arcing between phases.

It is noted that regardless of the embodiment, the series impedances described herein serve to reduce the service costs arising from line surge conditions in the meter. In particular, some meters include a fuse to reduce overcurrent in line surge situations. Thus, in the case of a power follow through due to arcing, the line fuse of the meter may open as a protective measure. While this measure may preserve vital elements of the meter, it nevertheless necessitates servicing to replace the fuse. The series impedances 274 and 276, by dissipating the power follow through due to arcing, may preserve the line fuse in many situations where otherwise the fuse might have opened. The series impedances 274 and 276 thus reduce the likelihood of requiring servicing in the event of an arcing condition. In some cases, a meter may not even require line fuses if series impedances 274 and 276 are employed.

It will also be noted that while many embodiments described herein contemplate the use series impedances that are not disposed on the circuit board 240, it may be possible to include the series impedances 274 and/or 276 on the circuit board 240. In particular, the series impedances 274 and 276 may be included on the circuit board 240 as long as they include an insulating sleeve that continues up to and on to the circuit board 240, at least through the line side leads of the impedances 274 and 276.

It will be appreciated that the above-described embodiments are merely exemplary and that those of ordinary skill in the art may readily devise their own adaptations and implementations that incorporate the principles of the invention and fall within the spirit and scope thereof. For example, single phase meters may benefit from the including of a series impedance as described herein to reduce power follow through on phase to neutral arcs, even though such arcs are generally less severe.

I claim:

1. An arrangement for obtaining measurable voltage signals in a utility meter, the measurable voltage signals representative of a power line voltage signal, the arrangement comprising:

a first connection to a phase of a power line;

a second connection to a reference of a power line;

a voltage divider circuit disposed on a circuit board and coupled between a first node and the second connection, the voltage divider circuit having an output configured to provide measurable voltage signals to a circuit operable to generate voltage measurement information, the voltage divider circuit having a first impedance value;

a series impedance element disposed apart from the circuit board, the series impedance element configured for current limiting and coupled between the first connection and the first node, the series impedance having a second impedance value.

2. The arrangement of claim 1, wherein a ratio of the second impedance value to the first impedance value is less than 1/1000.

3. The arrangement of claim 1, wherein the series impedance element is a wire wound resistor.

4. The arrangement of claim 1, wherein the series impedance element is a resistor having a resistance in excess of about 100 ohms.

5. The arrangement of claim i, wherein the second impedance value is less than about one thousand ohms and the first impedance value is in equal to or greater than about one million ohms.

6. The arrangement of claim 1, wherein the series impedance element has a central element and two leads, the arrangement further comprising an insulation sleeve that substantially covers the central element and at least one of the two leads.

7. The arrangement of claim 1 further comprising:

a third connection to a second phase of a power line;

a second voltage divider circuit disposed on the circuit board and coupled between a second node and the second connection, the second voltage divider circuit having an output configured to provide second phase measurable voltage signals to the circuit, the second voltage divider circuit having substantially the first impedance value;

a second series impedance element coupled between the third connection and the second node, the second series impedance element having approximately the second impedance value.

8. The arrangement of claim 7 further comprising a first sleeve disposed around one of the series impedance element and the second series impedance element.

9. The arrangement of claim 7 further comprising a first sleeve disposed around the series impedance element and a second sleeve disposed around the second series impedance element.

10. The arrangement of claim 1 wherein the voltage divider circuit includes more than two resistors connected in series.

11. An arrangement for obtaining measurable voltage signals in a utility meter, the measurable voltage signals representative of a power line voltage signal, the arrangement comprising:

a first connection to a phase of a power line;

a second connection to a reference of a power line;

a measurement circuit coupled between a first node and the second connection, the measurement circuit disposed on one or more circuit boards, the measurement circuit including a circuit operable to generate digital voltage measurement information, the measurement circuit having a first input impedance value; and a series impedance element having an impedance value of at least 100 ohms coupled between the first connection and the first node, and wherein first input impedance value is greater than the impedance of the series impedance element.

12. The arrangement of claim 11, wherein a ratio of the impedance value to the first input impedance value is less than 1/1000.

13. The arrangement of claim 11, wherein the series impedance element is a wire wound resistor.

14. The arrangement of claim 11, wherein the impedance value is less than about one thousand ohms and the first input impedance value is in equal to or greater than about one million ohms.

15. The arrangement of claim 11, wherein the series impedance element has a body and two leads, the arrangement further comprising an insulation sleeve that substantially covers the body and at least one of the two leads.

16. A method, comprising:

a) connecting a series impedance element between a line voltage connection of a utility meter and an input to a measurement circuit of a utility meter, the measurement circuit having an input impedance, the series impedance having a first impedance greater than 100 ohms and less than the input impedance; and b) connecting the line voltage connection of the utility meter to a power line being measured.

17. The method of claim 16, further comprising, prior to step a), electrically disconnecting the line voltage connection of the utility meter from the power line being measured.

18. The method of claim 16, wherein the series impedance element includes a central element and two leads, and further comprising placing an insulating sleeve over at least one of the two leads and the central element.

19. The method of claim 16, further comprising, prior to step b), connecting a second series impedance element between a second line voltage connection of the utility meter and an input to a second measurement circuit of the utility meter, the second measurement circuit having a second input impedance, the second series impedance element having a second impedance greater than 100 ohms and less than the second input impedance.

20. The method of claim 16, further comprising, prior to step b), calibrating the measurement circuit.

* * * * *